(12) United States Patent
Hu et al.

(10) Patent No.: US 12,276,683 B1
(45) Date of Patent: Apr. 15, 2025

(54) MEASUREMENT METHOD FOR IMPEDANCE OF CONVERTER AT MULTIPLE OPERATING POINTS BASED ON SECONDARY-SIDE DISTURBANCE

(71) Applicant: Zhejiang University, Hangzhou (CN)

(72) Inventors: Pengfei Hu, Hangzhou (CN); Quansen Rong, Hangzhou (CN); Yujing Li, Hangzhou (CN); Huanhai Xin, Hangzhou (CN); Ying Huang, Hangzhou (CN); Longyue Wang, Hangzhou (CN); Ping Ju, Hangzhou (CN); Daozhuo Jiang, Hangzhou (CN); Yanxue Yu, Hangzhou (CN); Dong Wang, Hangzhou (CN)

(73) Assignee: Zhejiang University, Hangzhou (CN)

( * ) Notice: Subject to any disclaimer, the term of this patent is extended or adjusted under 35 U.S.C. 154(b) by 0 days.

(21) Appl. No.: 18/970,987

(22) Filed: Dec. 6, 2024

(30) Foreign Application Priority Data

Aug. 14, 2024 (CN) .......................... 202411112483.4

(51) Int. Cl.
  *G01R 27/08* (2006.01)
  *G01R 19/00* (2006.01)
  *H02M 1/00* (2007.01)

(52) U.S. Cl.
  CPC .......... *G01R 27/08* (2013.01); *H02M 1/0009* (2021.05); *G01R 19/0084* (2013.01); *G01R 19/0092* (2013.01)

(58) Field of Classification Search
  CPC ........ G01R 27/00; G01R 27/02; G01R 27/08; G01R 19/00; G01R 19/0084;
  (Continued)

(56) References Cited

U.S. PATENT DOCUMENTS 9,859,887 B2 * 1/2018 Chiou .................... G01R 27/02

FOREIGN PATENT DOCUMENTS

CN 107608933 A 1/2018
CN 111209527 A 5/2020
(Continued)

OTHER PUBLICATIONS

Meng Zhiquan, et al., Generalized-impedance Measurement for Grid-connected Converters Based on Perturbation in Control System, Proceedings of the CSEE, 2018, pp. 5381-5391, vol. 38 No. 18.
(Continued)

*Primary Examiner* — Hoai-An D. Nguyen
(74) *Attorney, Agent, or Firm* — Bayramoglu Law Offices LLC

(57) ABSTRACT

A measurement method for the impedance of the converter at multiple operating points based on the secondary-side disturbance includes the following steps: superimposing the positive sequence current disturbance in the current sampling value; superimposing the positive sequence voltage disturbance in the voltage sampling value; determining whether measurement data of the converter at two or more current operating points are obtained, if so, based on the measurement data of the converter at two current operating points, calculating values of A(s) and B(s); further calculating values of coefficients at each frequency point, and obtaining the impedance value of the converter at multiple current operating points by calculation. The above-mentioned measurement method overcomes the disadvantages of high cost and complicated operation of the impedance measurement method based on the primary-side disturbance, and solves the problem of lacking the pre-judgment function.

2 Claims, 3 Drawing Sheets

(58) Field of Classification Search
CPC .. G01R 19/0092; H02M 1/00; H02M 1/0003; H02M 1/0009
USPC .............................. 324/600, 649, 691, 713
See application file for complete search history.

(56) References Cited

FOREIGN PATENT DOCUMENTS

| | | | | | |
|---|---|---|---|---|---|
| CN | 111239491 | A | | 6/2020 | |
| CN | 114325097 | A | | 4/2022 | |
| CN | 114325113 | A | | 4/2022 | |
| CN | 114966150 | A | | 8/2022 | |
| CN | 117031128 | A | | 11/2023 | |
| CN | 117990986 | A | | 5/2024 | |
| CN | 118980861 | A | * | 11/2024 | .............. G01R 27/08 |
| CN | 119001240 | A | * | 11/2024 | .............. G01R 27/08 |
| JP | 2019140899 | A | * | 8/2019 | .............. G06F 17/11 |

OTHER PUBLICATIONS

Wan Wei, et al., Measurement Method for Converter Generalized Impedance in Sub-and Super-synchronous Band Based on Perturbation on Secondary Side, Automation of Electric Power Systems, 2020, pp. 19-25, vol. 44 No. 14.

Chu Sun, et al., Self-Measurement of the Admittance Matrix of AC-DC Power Converter by Internal Harmonic Injection, IEEE Transactions on Industrial Electronics, 2024, pp. 1503-1513, vol. 71 No.2.

Wei Liu, et al., Stability Region Analysis of Grid-Tied Voltage Sourced Converters Using Variable Operating Point Impedance Model, IEEE Transactions on Power Systems, 2023, pp. 1125-1137, vol. 38 No. 2.

Mengfan Zhang, et al., Artificial Neural Network Based Identification of Multi-Operating-Point Impedance Model, IEEE Transactions on Power Electronics, 2021, pp. 1231-1235, vol. 36 No. 2.

Mengfan Zhang, et al., Physics-Informed Neural Network Based Online Impedance Identification of Voltage Source Converters, IEEE Transactions on Power Electronics, 2023, pp. 3717-3728, vol. 70 No. 4.

Yan Wenjun, Research on Key Techniques for Optimizing the Operation and Control of Dynamic Voltage Restorer Powered by Energy Storage System, 2023, Zhejiang University, pp. 1-134.

Yang Chaoran, et al., Applicability Analysis of the Generalized-impedance Stability Criterion for Converters Considering the Outer-loop Dynamics, Proceedings of the CSEE, 2021, pp. 3012-3023, vol. 41 No. 9.

Wan Wei, Modeling and Secondary Side Measurement Method of Generalized Impedance of Gridconnected Converters under Arbitrary Power Factor, Zhejiang University, 2020, pp. 1-73.

Zhenjie Li, et al., Constant Current Charging and Maximum Efficiency Tracking Control Scheme for Supercapacitor Wireless Charging, IEEE Transactions on Power Electronics, 2018, pp. vol. 33 No. 10.

Song Shaojian, et al., Research on Rotor Side Impedance Modeling of DFIG Wind Turbine Considering Transformer and Line Impedance, Power System Technology, 2020, pp. 1392-1399, vol. 44 No. 4.

* cited by examiner

MEASUREMENT METHOD FOR IMPEDANCE OF CONVERTER AT MULTIPLE OPERATING POINTS BASED ON SECONDARY-SIDE DISTURBANCE

CROSS REFERENCE TO THE RELATED APPLICATIONS

This application is based upon and claims priority to Chinese Patent Application No. 202411112483.4, filed on Aug. 14, 2024, the entire contents of which are incorporated herein by reference.

TECHNICAL FIELD

The invention relates to the field of converter impedance measurement technology, in particular to a measurement method for impedance of a converter at multiple operating points based on a secondary-side disturbance.

BACKGROUND

China's power grid has gradually shown a pattern dominated by clean energy and with ultra-high voltage as the backbone network, among them, the proportion of renewable energy power generation such as wind power and photovoltaic continues to increase and has attracted widespread attention in the industry. With the increasing proportion of renewable energy equipment with converters as a grid-connected interface, the interaction between new energy stations and AC power grids leads to serious broadband oscillation problems in converter grid-connected systems. In recent years, there have been many broadband oscillation problems related to new energy sources, involving different frequency bands such as low frequency, medium frequency, and high frequency, for example, sub-synchronous oscillation occurs in a flexible DC demonstration project offshore wind power in China, and 6-800 Hz oscillation occurs in the wind-solar cable transmission system, which poses a severe challenge to the power industry.

The small-signal stability analysis of the system based on the impedance method is one of the effective means to analyze and solve the above-mentioned broadband oscillation problem, where the acquisition of the broadband impedance characteristics of each converter is the fundamental of this method. How to accurately, quickly, and low-costly realize the converter port impedance measurement is a major technical problem at present. Furthermore, the power of the new energy station has a great fluctuation, and the operating point of the converter changes in real-time, and the corresponding port impedance characteristics also change accordingly, how to calculate the impedance characteristics of the converter at different operating points through a limited number of converter impedance measurement processes to reduce the actual number of converter impedance measurements required is the core problem to be solved by the invention.

The existing methods for measuring the impedance of the converter are as follows:

(1) Method 1: Impedance Measurement Method Based on a Primary-Side Disturbance

The disturbance voltage source is connected in series or the disturbance current source is connected in parallel at the port of the impedance device to be tested, and the broadband impedance characteristics of the port are calculated according to the output current of the port or port voltage of the impedance device to be tested. For measuring the impedance of the converter at multiple operating points one by one, this method is costly and complicated to operate.

(2) Method 2: Impedance measurement method based on a secondary-side disturbance

[1] The invention with the public number CN202111569526.8 discloses a Positive And Negative Sequence Impedance Measurement Method For Inverter Based On Sampling Signal Disturbance Superposition:

This method superimposes a sine wave at a specific disturbance frequency at the current sampling point of the converter at point of common coupling, like the invention, the disturbance injection is performed on the secondary-side, but at the same time, it is necessary to change the equivalent impedance of the power grid in the main circuit manually before measurement, that is, a small inductor element is connected in series. Two measurement processes are required, the port voltage and current responses during the two measurement processes are obtained by Fourier analysis, and the positive and negative sequence broadband impedances of the impedance device (converter) to be measured are calculated. This method requires a switchable inductor element in the main circuit of the primary-side, which is costly and complicated to operate. The operation complexity increases when measuring the impedance of the converter at multiple operating points, and it needs to be measured one by one.

[2] Meng Zhiquan et al. published the article *Generalized-impedance Measurement for Grid-connected Converters Based on Perturbation in Control System* In 2018 And [3] WAN Wei Et Al. discussed *Measurement Method for Converter Generalized Impedance in Sub- and Super-synchronous Band Based on Perturbation on Secondary Side* in 2020:

This method injects disturbance into the controller of the converter, which is the same as Method 2, it needs to carry out two measurement processes, the port voltage and current responses in the two measurement processes are obtained by Fourier analysis, and the positive and negative sequence impedances of the impedance device (converter) to be measured are calculated. However, from the simulation results in the only two literatures, this method may only measure the low-frequency impedance below 300 Hz, or even below 100 Hz, so the broadband impedance measurement can not be fulfilled. Disturbances need to be injected into the controller, the method fails when the converter manufacturer does not open its controller in the actual project. When measuring the impedance of the converter at multiple operating points, it is necessary to measure the operating points one by one, and the operation is complicated.

[4] Sun Chu et al. published the article *Self-Measurement of the Admittance Matrix of AC-DC Power Converter by Internal Harmonic Injection* in 2024, which recorded that the disturbance is added to the controller of the converter, by injecting the disturbance at the two positions of the reference voltage generation and the sampling voltage of the phase-locked loop, the admittance values of the corresponding loops are measured respectively, and then the impedance of the device to be tested is obtained by adding them. However, this method is based on the premise that the controller of the converter is open and its control structure is known, in practical engineering, if the converter manufacturer does not open its controller, this method will fail and have great limitations. At the same time, the method changes the position and number of disturbances injected by different controllers, and the black box impedance measurement cannot be realized in practice. When measuring the impedance of the converter at multiple operating points, the operation is complicated.

[5] The invention with the public number CN202410396063.7 discloses a *Converter Impedance Measurement Method:*

This method injects three-phase symmetrical voltage disturbance and current disturbance at the sampling point of the converter in turn, and calculates the port impedance of the converter through the disturbance response of the converter output. This method only measures the impedance of the converter at a single operating point, and can not quickly measure or calculate the impedance of the converter at multiple operating points, the operation complexity increases when measuring the impedance of the converter at multiple operating points.

(3) Method 3: Multi-Operating Point Impedance Acquisition Based on Impedance Model Parameter Identification

[1] Liu Wei and Xie Xiaorong et al. published the *Stability Region Analysis Of Grid-Tied Voltage Sourced Converters Using Variable Operating Point Impedance Model* in 2023, which recorded the use of at least 10 sets of measurement data of the broadband impedance of the converter based on the primary-side, the control parameters of each part are identified by simultaneous equations, and the impedance model of the converter at multiple operating points is obtained. There are two shortcomings of this method: First, the number of measurement data of 10 groups of broadband impedance based on the primary-side converter is large, and it is difficult to obtain these data in practice; second, this method is difficult to achieve real-time multi-operating point impedance measurement of the converter. It takes a long time to re-obtain the multi-operating point impedance after the control loop of the converter changes.

(4) Method 4: Multi-Operating-Point Impedance Acquisition of Converter Based on Machine Learning Algorithm

[1] Zhang Mengfang and Wang Xiongfei published Artificial Neural Network Based Identification Of Multi-Operating-Point Impedance Model in 2021 and [2] Zhang Mengfang and Wang Xiongfei published Physics-Informed Neural Network Based Online Impedance Identification Of Voltage Source Converters in 2023, both of which recorded that the measurement data of the broadband impedance of a converter based on primary-side disturbance and machine learning algorithms are used to obtain the multi-operating point impedance of the converter by training the neural network. There are two disadvantages of this method: First, it is difficult to obtain enough measurement data to form a data set for neural network training in practice, the measurement data refers to the measurement data of the broadband impedance of a converter based on primary-side disturbance; second, the interpretability of this method is poor.

SUMMARY

The purpose of the invention is to provide a measurement method for impedance of a converter at multiple operating points based on a secondary-side disturbance, so as to overcome the disadvantages of high cost and complicated operation of the traditional impedance measurement method based on the primary-side disturbance, and solve the problem that the existing impedance measurement method based on the secondary-side disturbance needs to measure each operating point when obtaining the impedance of the converter at multiple operating points and lacks the pre-judgment function.

In order to achieve the above purpose, the invention provides a measurement method for impedance of a converter at multiple operating points based on a secondary-side disturbance, which includes the following steps:

S1, superimposing a positive sequence current disturbance in a current sampling value, and recording an output voltage and current waveform of a converter;

S2, superimposing a positive sequence voltage disturbance in a voltage sampling value, and recording an output voltage and current waveform of the converter;

S3, determining whether measurement data of the converter at two or more current operating points are obtained, if a result is no, waiting for a change of the current operating points of the converter, repeating above measurement process, measuring impedance of the converter at the new current operating points and recording the waveform data, if the result is yes, proceeding S4;

S4, based on the measurement data of the converter at two current operating points, calculating values of expressions $A_s(s)$ and $B_s(s)$ at different frequency points;

S5, further calculating values of coefficients $a_0$, $a_1$, $b_0$, $b_1$ at each frequency point, and finally obtaining an impedance value of the converter at multiple current operating points by calculation.

Preferably, before S1, it also includes the following: The converter with an inductance capacitance inductance (LCL) filter is adopted, a controller is controlled by a single current loop, and a phase angle is generated by a phase-locked loop, a theoretical model of the positive sequence impedance on an alternating current side (AC side) of the converter is as follows:

$$Z_p(s) = \frac{sL_1 + sL_2 + \frac{L_1 L_2 C_f s^3}{C_f R_d s + 1} + K_{PWM} G_i(s - j2\pi f_1) G_{id}}{1 + \frac{L_1 C_f s^2}{C_f R_d s + 1} - K_{PWM} G_i(s - j2\pi f_1) T_p(s) I_1 e^{j\varphi_{i1}} 1 - MT_p(s) - K_{PWM} K_f G_{vd}} \quad (1)$$

where $$\begin{cases} M = V_1 \times \left(1 + \frac{L_1 C_f s^2}{C_f R_d s + 1}\right) + I_1 e^{j\varphi_{i1}} \times \left(sL_1 + sL_2 + \frac{L_1 L_2 C_f s^3}{C_f R_d s + 1}\right) \\ T_p(s) = \frac{1}{2} \frac{H_{p11}(s - j2\pi f_1) G_{vd}}{1 + V_1 H_{p11}(s - j2\pi f_1)} \end{cases} \quad (2)$$

where s is a differential operator, $L_1$ and $L_2$ are filter inductance values, $C_f$ is a filter capacitance value, $R_d$ is a resistance value in series with the filter capacitance, $G_i(s-j2\pi f_1)$ is a transfer function of a current loop controller of the converter, $f_1$ is a frequency of 50 Hz, $I_1 e^{j\varphi_{i1}}$ is a current operating point of the converter, $I_1$ is a current amplitude, $V_1$ is a voltage operating point of the converter, $H_{pll}(s-j2\pi f_1)$ is a transfer function of a phase-locked loop controller, $K_f$ is a voltage feedforward coefficient, $G_{id}$ is an output current sampling delay, $G_{vd}$ is a sampling delay of the voltage at point of common coupling (PCC), $K_{PWM}$ is a voltage gain of the converter;

Formula (1) is simplified as:

$$Z_p(s) = \frac{Z_{filter}(s) + A_s(s)}{\Gamma_{filter}(s) + B_s(s)}; \quad (3)$$

where $$\begin{cases} Z_{filter}(s) = sL_1 + sL_2 + \dfrac{L_1 L_2 C_f s^3}{C_f R_d s + 1} \\ \Gamma_{filter}(s) = 1 + \dfrac{L_1 C_f s^2}{C_f R_d s + 1} \end{cases}; \quad (4)$$

Preferably, in S1, a positive sequence current disturbance $\Delta i_t$ is superimposed on a current sampling value $i_{g1}$, and a calculation expression of the converter under the secondary-side current disturbance is:

$$i_{g1} = \frac{-B_s(s)}{Z_{filter}(s) + A_s(s)} v_{p1} + \Delta i_t \times G_c; \quad (5)$$

where $v_{p1}$ is a voltage of the converter at point of common coupling when the disturbance is superimposed on the current sampling value;

$$G_c = \frac{-A_s(s)}{Z_{filter}(s) + A_s(s)}. \quad (6)$$

Preferably, in S2, a positive sequence voltage disturbance $\Delta v_t$ is injected into a voltage sampling value $v_{p2}$, and the calculation expression of the converter under the secondary-side voltage disturbance is:

$$i_{g2} = \frac{-B_s(s)}{Z_{filter}(s) + A_s(s)} (v_{p2} + \Delta v_t); \quad (7)$$

where $i_{g2}$ is an output current of the converter when the disturbance is superimposed on the voltage sampling value, the value of $G_c$ is obtained by solving simultaneous equations (5) and (7):

$$G_c = \frac{i_{g1} \times (v_{p2} + \Delta v_t) - i_{g2} \times v_{p1}}{\Delta i_t \times (v_{p2} + \Delta v_t)} \quad (8)$$

Preferably, S4 is as follows: according to Formula (6) and Formula (8), the value of $A_s(s)$ is obtained:

$$A_s(s) = -\frac{G_c}{1 + G_c} Z_{filter}(s); \quad (9)$$

Formula (9) is substituted into Formula (7), the value of $B_s(s)$ is obtained:

$$B_s(s) = \frac{-i_{g2}}{v_{p2} + \Delta v_t} (Z_{filter}(s) + A_s(s)). \quad (10)$$

Preferably, in S5, since the voltage operating point of the converter generally remains unchanged or changes in a small range without major changes in a system operation, $V_1$ can be considered to be basically unchanged under a certain stable operating condition, according to Formula (1) and Formula (2), and $A_s(s)$ and $B_s(s)$ are expressed as a linear function of the current operating point $I_1$ of the converter, that is:

$$\begin{cases} A_s(s) = a_0 + a_1 I_1 \\ B_s(s) = b_0 + b_1 I_1 \end{cases}; \quad (11)$$

a relational expression between a impedance value of the converter and its different current operating points is obtained by solving a value of the coefficients $a_0$, $a_1$, $b_0$, $b_1$ under a disturbance frequency $f_p$, and then the impedance value of the converter at other current operating points is calculated by the relational expression without repeated measurement at each operating point.

Preferably, the method for solving the values of the coefficients $a_0$, $a_1$, $b_0$, $b_1$ is:

When the voltage operating point of the converter changes in a small range, two different current operating points $I_{01}$, $I_{02}$ of the converter are randomly selected, and the impedance measurement of a full frequency band is performed according to the above method, and the values of the expressions $A_s(s)$ and $B_s(s)$ of the converter at these two current operating points are obtained; then, at each measurement frequency point, the values of the coefficients $a_0$, $a_1$, $b_0$, $b_1$ are obtained by simultaneous calculation of Equations (12) and (13):

$$\begin{cases} a_0 + a_1 I_{01} = A_s(s)|_{I_1 = I_{01}} \\ a_0 + a_1 I_{02} = A_s(s)|_{I_1 = I_{02}} \end{cases}; \quad (12)$$

$$\begin{cases} b_0 + b_1 I_{01} = B_s(s)|_{I_1 = I_{01}} \\ b_0 + b_1 I_{02} = B_s(s)|_{I_1 = I_{02}} \end{cases}. \quad (13)$$

Therefore, the invention adopts the above-mentioned measurement method for the impedance of the converter at multiple operating points based on the secondary-side disturbance, and the beneficial effects are as follows:

(1) The invention provides a fast and low-cost method for measuring and calculating the impedance of the converter at multiple operating points, so as to overcome the disadvantages of high cost and complicated operation of the traditional impedance measurement method based on the primary-side disturbance.

(2) The invention can solve the problem that the existing impedance measurement method based on the secondary-side disturbance needs to measure each operating point when obtaining the impedance of the converter at multiple operating points and lacks the pre-judgment function.

(3) Comparing with the impedance model parameter identification and the machine learning algorithm, the invention reduces the requirement of massive measurement data of the impedance of the converter based on primary-side disturbance when measuring the impedance of the converter at multiple operating points, so as to quickly measure and calculate the impedance value of the converter at multiple operating points.

The following is a further detailed description of the technical scheme of the invention through drawings and an embodiment.

DETAILED DESCRIPTION OF THE EMBODIMENTS

Figure 1:
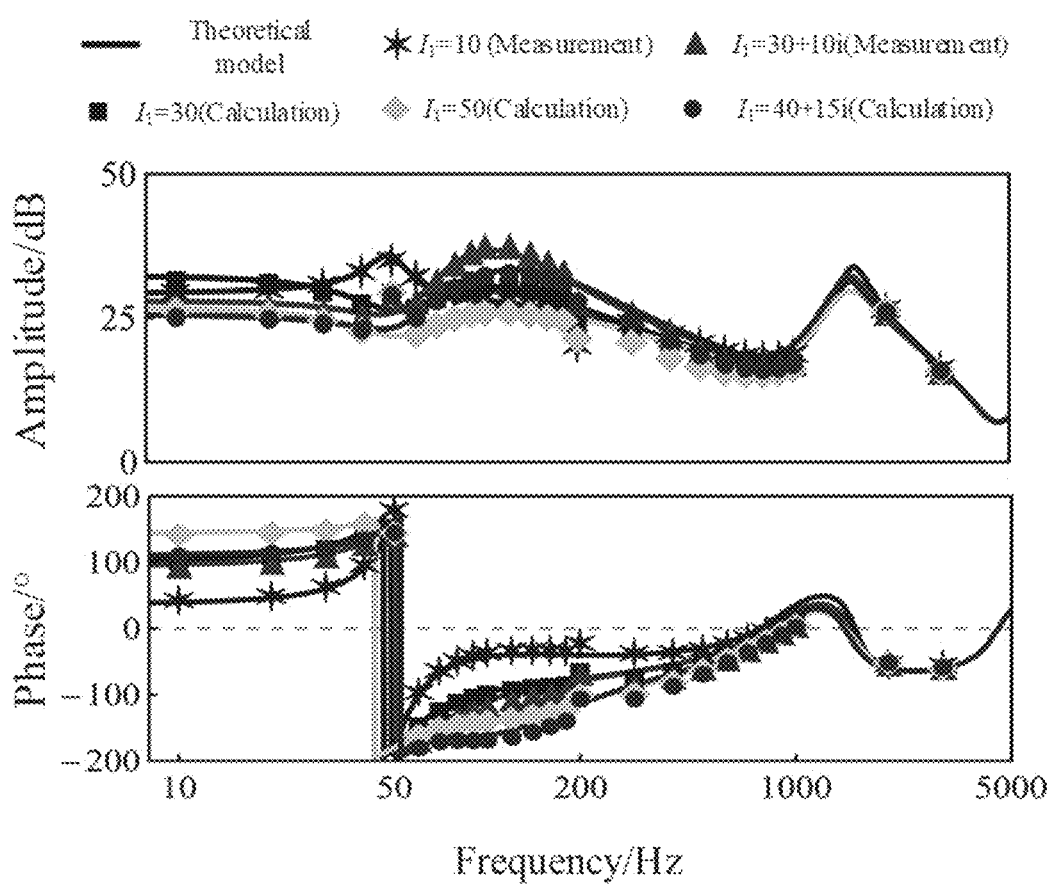
FIG. 1 is an impedance result diagram of the measurement and calculation of the measurement method for the impedance of the converter at multiple operating points based on the secondary-side disturbance, the impedance result diagram includes the impedance amplitude diagram (upper) and the impedance phase angle diagram (lower).

The following is a further explanation of the technical scheme of the invention through drawings and an embodiment.

Unless otherwise defined, the technical terms or scientific terms used in the invention should be understood by people with general skills in the field to which the invention belongs.

The technical solution of measurement of the impedance of the converter at multiple operating points proposed by the invention includes the measurement process of two injection disturbances, and the single-frequency sine wave is selected as the disturbance signal. At the same time, the purpose of the invention can also be achieved by changing the type of injected disturbance signal, such as injected pulse wave, random binary sequence, and various broadband signals, which should belong to the protection range of the invention. It can also inject asymmetric disturbance signals at multiple frequency points at one time, the values of the expressions $A_s(s)$ and $B_s(s)$ of the converter at different frequency points at a certain current operating point are simultaneously measured, and then the broadband impedance values of the converter at multiple operating points according to the method of the invention are calculated, which is essentially the same as the invention.

A measurement method for impedance of the converter at multiple operating points based on the secondary-side disturbance is proposed, including the following steps:

$$Z_p(s) = \frac{sL_1 + sL_2 + \frac{L_1 L_2 C_f s^3}{C_f R_d s + 1} + K_{PWM} G_i(s - j2\pi f_1) G_{id}}{1 + \frac{L_1 C_f s^2}{C_f R_d s + 1} - K_{PWM} G_i(s - j2\pi f_1) T_p(s) I_1 e^{j\varphi_{i1}} - MT_p(s) - K_{PWM} K_f G_{vd}} \quad (1)$$

where $$\begin{cases} M = V_1 \times \left(1 + \frac{L_1 C_f s^2}{C_f R_d s + 1}\right) + I_1 e^{j\varphi_{i1}} \times \left(sL_1 + sL_2 + \frac{L_1 L_2 C_f s^3}{C_f R_d s + 1}\right) \\ T_p(s) = \frac{1}{2} \frac{H_{pll}(s - j2\pi f_1) G_{vd}}{1 + V_1 H_{pll}(s - j2\pi f_1)} \end{cases} \quad (2)$$

$$Z_p(s) = \frac{sL_1 + sL_2 + \frac{L_1 L_2 C_f s^3}{C_f R_d s + 1} + K_{PWM} G_i(s - j2\pi f_1) G_{id}}{1 + \frac{L_1 C_f s^2}{C_f R_d s + 1} - K_{PWM} G_i(s - j2\pi f_1) T_p(s) I_1 e^{j\varphi_{i1}} - MT_p(s) - K_{PWM} K_f G_{vd}}$$

where $K_f$ is the voltage feedforward coefficient, $G_{id}$ is the output current sampling delay, $G_{vd}$ is the sampling delay of the voltage at PCC, $K_{PWM}$ is the voltage gain of the converter;

Formula (1) is simplified as:

$$Z_p(s) = \frac{Z_{filter}(s) + A_s(s)}{\Gamma_{filter}(s) + B_s(s)} \quad (3)$$

where $$\begin{cases} Z_{filter}(s) = sL_1 + sL_2 + \frac{L_1 L_2 C_f s^3}{C_f R_d s + 1} \\ \Gamma_{filter}(s) = 1 + \frac{L_1 C_f s^2}{C_f R_d s + 1} \end{cases} \quad (4)$$

The converter with LCL filter is adopted, the controller adopts the traditional single current loop control, and the phase angle is generated by the phase-locked loop, the theoretical model of the positive sequence impedance on the alternating current side of the converter is as follows:

S1, the positive sequence current disturbance $\Delta i_t$ is superimposed on a current sampling value $i_{g1}$ for the first time, and then the calculation expression of the converter under the secondary-side current disturbance is:

$$i_{g1} = \frac{-B_s(s)}{Z_{filter}(s) + A_s(s)} v_{p1} + \Delta i_t \times G_c; \quad (5)$$

where $v_{p1}$ is the voltage of the converter at Point of Common Coupling when the disturbance is superimposed on the current sampling value;

$$G_c = \frac{-A_s(s)}{Z_{filter}(s) + A_s(s)}. \quad (6)$$

S2, the positive sequence voltage disturbance $\Delta v_t$ is superimposed on the voltage sampling value $v_{p2}$ for the second time, and then the calculation expression of the converter under the secondary-side voltage disturbance is:

$$i_{g2} = \frac{-B_s(s)}{Z_{filter}(s) + A_s(s)}(v_{p2} + \Delta v_t); \quad (7)$$

where $i_{g2}$ is an output current of the converter when the disturbance is superimposed on the voltage sampling value.

The value of $G_c$ is obtained by solving simultaneous equations (5) and (7):

$$G_c = \frac{i_{g1} \times (v_{p2} + \Delta v_t) - i_{g2} \times v_{p1}}{\Delta i_t \times (v_{p2} + \Delta v_t)} \quad (8)$$

S3, whether measurement data of the converter at two or more current operating points are obtained is determined, if a result is no, wait for the change of the current operating points of the converter. Repeat the above measurement process, and the impedance of the converter at the new current operating points is measured and the waveform data is recorded, if the result is yes, proceed S4;

S4, based on the measurement data of the converter at two current operating points, the values of expressions $A_s(s)$ and $B_s(s)$ at different frequency points are calculated; specifically:

According to Formula (6) and Formula (8), the value of $A_s(s)$ is obtained:

$$A_s(s) = -\frac{G_c}{1+G_c} Z_{filter}(s); \quad (9)$$

Formula (9) is substituted into Formula (7), the value of $B_s(s)$ is obtained:

$$B_s(s) = \frac{-i_{g2}}{v_{p2} + \Delta v_t} (Z_{filter}(s) + A_s(s)). \quad (10)$$

S5, since the voltage operating point of the converter generally remains unchanged or changes in a small range without major changes in the system operation, $V_1$ can be considered to be basically unchanged under a certain stable operating condition, according to Formula (1) and Formula (2), and $A_s(s)$ and $B_s(s)$ are expressed as a linear function of the current operating point $I_1$ of the converter, that is:

$$\begin{cases} A_s(s) = a_0 + a_1 I_1 \\ B_s(s) = b_0 + b_1 I_1 \end{cases} \quad (11)$$

When the voltage operating point of the converter changes in a small range, the values of the coefficients $a_0$, $a_1$, $b_0$, $b_1$ are basically unchanged. Therefore, as long as the value of the coefficients $a_0$, $a_1$, $b_0$, $b_1$ under the disturbance frequency is solved, the relational expression between the impedance value of the converter and its different current operating points can be obtained, the method for solving the values of the coefficients $a_0$, $a_1$, $b_0$, $b_1$ is:

When the voltage operating point of the converter changes in a small range, two different current operating points $I_{01}$, $I_{02}$ of the converter are randomly selected, and the impedance measurement of the full frequency band is performed according to the above method, and the values of the expressions $A_s(s)$ and $B_s(s)$ are obtained; then, at each measurement frequency point, the values of the coefficients $a_0$, $a_1$, $b_0$, $b_1$ are obtained by simultaneous calculation of Equations (12) and (13):

$$\begin{cases} a_0 + a_1 I_{01} = A_s(s)|_{I_1 = I_{01}} \\ a_0 + a_1 I_{02} = A_s(s)|_{I_1 = I_{02}} \end{cases}; \quad (12)$$

$$\begin{cases} b_0 + b_1 I_{01} = B_s(s)|_{I_1 = I_{01}} \\ b_0 + b_1 I_{02} = B_s(s)|_{I_1 = I_{02}} \end{cases}. \quad (13)$$

The impedance value of the converter at other current operating points is calculated by the relational expression without repeated measurement at each operating point.

So far, through the measurement data of two different current operating points of the converter, the relational expression between the port impedance of the converter in a certain voltage range and the impedance at different current operating points can be obtained, when the output power of the converter changes, that is, the current operating point changes while the voltage operating point remains unchanged or changes in a small range, the current operating point of the converter can be directly substituted into the calculated relational expression, so as to obtain the broadband impedance value of the converter at the new current operating point without re-measurement.

When the converter voltage changes greatly, it is only necessary to repeat the steps of this invention to recalculate the impedance value at different current operating points of the converter under the new voltage operating point.

Embodiment 1

Taking a converter with the LCL filter as an example, the controller adopts the traditional single current loop control, and the phase angle is generated by the phase-locked loop. The theoretical model of the positive sequence impedance on the AC side is as Formula (1).

1) Two different current operating points $I_{01}$=10A, $I_{02}$= (30+10i) A are selected, firstly, the secondary-side current disturbance and voltage disturbance are injected according to the method provided by the invention, and the values of the expressions of $A_s(s)$ and $B_s(s)$ of different frequency points of the converter at the selected two current operating points are measured and calculated (Formulas (5)-(10)), and then the values of coefficients, and are calculated according to Formulas (12)-(13). Finally, the values of the calculated coefficients $a_0$, $a_1$, $b_0$, $b_1$ are substituted into Formula (3) and Formula (11), and the relational expression between the impedance of the converter in a certain voltage range and different current operating points is obtained, the calculated impedance results at different current operating points are obtained as shown in FIG. 1.

In FIG. 1, the solid line represents the impedance theoretical model of the converter at different current operating points, the operating points $I_{01}$=10A, $I_{02}$=(30+10i) A are measured first to obtain the impedance data, according to Formula (5)-Formula (10), the values of the expressions $A_s(s)$ and $B_s(s)$ of different frequency points can be obtained. The impedance values of the other three current operating points are obtained by calculation, because the voltage does not change obviously, the values of the coefficients $a_0$, $a_1$, $b_0$, $b_1$ are basically unchanged. The results show that the invention is effective for measuring and calculating the impedance of the converter at multiple operating points.

Figure 2:
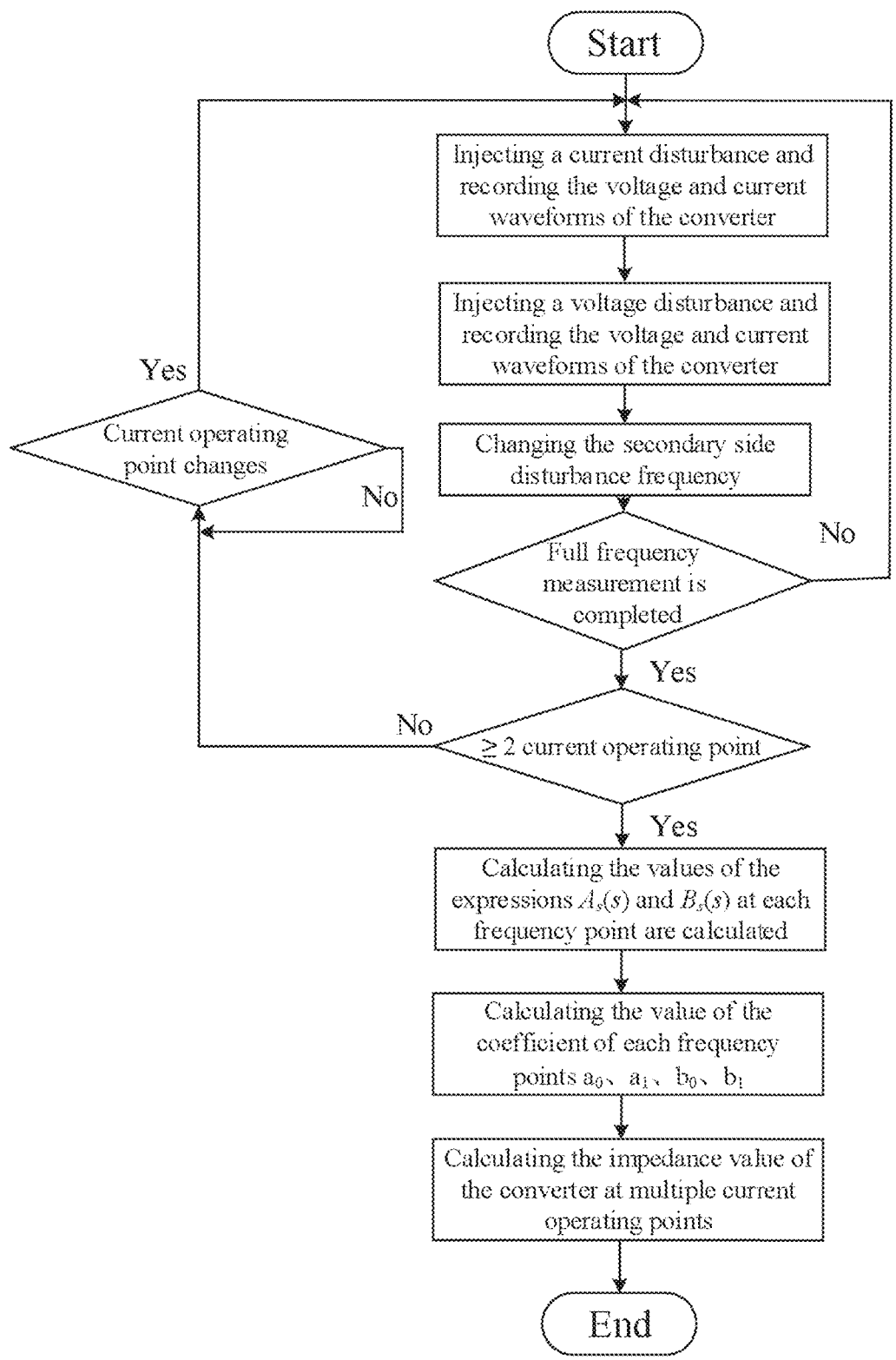
FIG. 2 is an overall flow chart of the embodiment of the measurement method for impedance of the converter at multiple operating points based on the secondary-side disturbance.

As shown in FIG. 2, the full-band impedance value of the converter at a certain steady-state operating point is first measured, the method is as follows: the current disturbance is injected for the first time and the voltage and current waveforms of the converter are recorded, the voltage disturbance is injected for the second time and the voltage and current waveforms of the converter are recorded, and then the secondary-side disturbance frequency is changed until all frequency points are measured.

Then, whether the measurement data of the converter at two or more current operating points are obtained is determined, if the result is no, wait for the current operating point of the converter to change. Then, the above measurement process is repeated at the new current operating point of the converter, the impedance of the converter at the new current operating point is measured and the waveform data is recorded.

Then, based on the measurement data of the converter at two current operating points, the values of the expressions of $A_s(s)$ and $B_s(s)$ at each frequency point are calculated, and the values of the coefficients $a_0$, $a_1$, $b_0$, $b_1$ at each frequency point are further calculated, finally, the impedance value of the converter at multiple current operating points is calculated.

Figure 3:
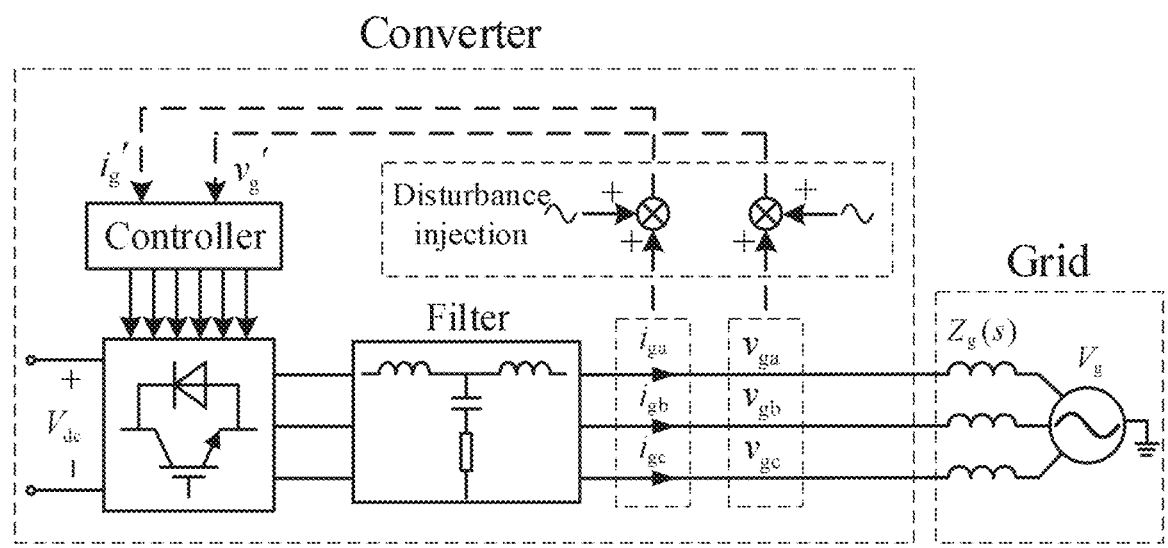
FIG. 3 is a schematic diagram of the calculation method of the expressions $A_s(s)$ and $B_s(s)$ of the measurement method for the impedance of the converter at multiple operating points based on the secondary-side disturbance.

In FIG. 3, $V_{dc}$ is the DC side voltage of the converter, $V_g$ is the grid voltage, and $Z_g(s)$ is the equivalent impedance of the grid. $i_g$ and $v_g$ are the output current and voltage of the converter respectively. After the disturbance injection, the injected $i_g'$ and $v_g'$ are input into the controller of the converter. The current disturbance and voltage disturbance are injected in turn, and the voltage and current waveforms of the converter after the disturbance injection are recorded, the disturbance component is extracted by Fourier analysis, and the values of the expressions of $A_s(s)$ and $B_s(s)$ at the measurement frequency are calculated.

Therefore, the invention adopts the above-mentioned measurement method for the impedance of the converter at multiple operating points based on the secondary-side disturbance, comparing with the impedance model parameter identification and the machine learning algorithm, the invention reduces the requirement of massive measurement data of the impedance of the converter based on primary-side disturbance when measuring the impedance of the converter at multiple operating points so as to quickly measure and calculate the impedance value of the converter at multiple operating points.

Finally, it should be explained that the above embodiments are only used to explain the technical scheme of the invention rather than restrict it, although the invention is described in detail with reference to the better embodiment, ordinary technical personnel in this field should understand that they can still modify or replace the technical scheme of the invention, and these modifications or equivalent substitutions cannot make the modified technical scheme out of the spirit and scope of the technical scheme of the invention.

What is claimed is:

1. A measurement method for impedance of a converter at a plurality of operating points based on a secondary-side disturbance, comprising the following steps:
   S1, superimposing a positive sequence current disturbance in a current sampling value, and recording a first output voltage and current waveform of the converter;
   S2, superimposing a positive sequence voltage disturbance in a voltage sampling value, and recording a second output voltage and current waveform of the converter;
   S3, determining whether measurement data of the converter at two or more current operating points are obtained, when a result is no, waiting for a change of the two or more current operating points of the converter, repeating above measurement process, measuring impedance of the converter at new current operating points and recording waveform data, when the result is yes, proceeding S4;
   S4, based on the measurement data of the converter at two current operating points, calculating values of expressions $A_s(s)$ and $B_s(s)$ at different frequency points;
   S5, further calculating values of coefficients $a_0$, $a_1$, $b_0$, $b_1$ at each frequency point, and finally obtaining an impedance value of the converter at a plurality of current operating points by a calculation;
   before the S1, the measurement method further comprises the following: a converter with an inductance capacitance inductance (LCL) filter is adopted, a controller is controlled by a single current loop, and a phase angle is generated by a phase-locked loop, a theoretical model of the positive sequence impedance on an alternating current (AC) side of the converter is as follows:

$$Z_p(s) = \frac{sL_1 + sL_2 + \frac{L_1 L_2 C_f s^3}{C_f R_d s + 1} + K_{PWM} G_i(s - j2\pi f_1) G_{id}}{1 + \frac{L_1 C_f s^2}{C_f R_d s + 1} - K_{PWM} G_i(s - j2\pi f_1) T_p(s) I_1 e^{j\varphi_{i1}} - MT_p(s) - K_{PWM} K_f G_{vd}} \quad (1)$$

wherein $$\begin{cases} M = V_1 \times \left(1 + \frac{L_1 C_f s^2}{C_f R_d s + 1}\right) + I_1 e^{j\varphi_{i1}} \times \left(sL_1 + sL_2 + \frac{L_1 L_2 C_f s^3}{C_f R_d s + 1}\right) \\ T_p(s) = \frac{1}{2} \frac{H_{pll}(s - j2\pi f_1) G_{vd}}{1 + V_1 H_{pll}(s - j2\pi f_1)} \end{cases} \quad (2)$$

wherein s is a differential operator, $L_1$ and $L_2$ are filter inductance values, $C_f$ is a filter capacitance value, $R_d$ is a resistance value in series with a filter capacitance, $G_i(s-j2\pi f_1)$ is a transfer function of a current loop controller of the converter, $f_1$ is a frequency of 50 Hz, $I_1 e^{j\varphi_{i1}}$ is a current operating point of the converter, $I_1$ is a current amplitude, $V_1$ is a voltage operating point of the converter, $H_{pll}(s-j2\pi f_1)$ is a transfer function of a phase-locked loop controller, $K_f$ is a voltage feedforward coefficient, $G_{id}$ is an output current sampling delay, $G_{vd}$ is a sampling delay of a voltage at point of common coupling (PCC), and $K_{PWM}$ is a voltage gain of the converter;

a formula (1) is simplified as:

$$Z_p(s) = \frac{Z_{filter}(s) + A_s(s)}{\Gamma_{filter}(s) + B_s(s)}; \quad (3)$$

wherein $$\begin{cases} Z_{filter}(s) = sL_1 + sL_2 + \frac{L_1 L_2 C_f s^3}{C_f R_d s + 1} \\ \Gamma_{filter}(s) = 1 + \frac{L_1 C_f s^2}{C_f R_d s + 1} \end{cases}; \quad (4)$$

in the S1, the positive sequence current disturbance $\Delta i_t$ is superimposed on the current sampling value $i_{g1}$, and a calculation expression of the converter under a secondary-side current disturbance is:

$$i_{g1} = \frac{-B_s(s)}{Z_{filter}(s) + A_s(s)} v_{p1} + \Delta i_t \times G_c; \quad (5)$$

wherein $v_{p1}$ is a voltage of the converter at a point of common coupling when the positive sequence current disturbance is superimposed on the current sampling value;

$$G_c = \frac{-A_s(s)}{Z_{filter}(s) + A_s(s)}; \quad (6)$$

in the S2, the positive sequence voltage disturbance $\Delta v_t$ is injected into the voltage sampling value $v_{p2}$, and a calculation expression of the converter under a secondary-side voltage disturbance is:

$$i_{g2} = \frac{-B_s(s)}{Z_{filter}(s) + A_s(s)}(v_{p2} + \Delta v_t); \quad (7)$$

wherein $i_{g2}$ is an output current of the converter when the positive sequence voltage disturbance is superimposed on the voltage sampling value, and a value of $G_c$ is obtained by solving simultaneous equations (5) and (7):

$$G_c = \frac{i_{g1} \times (v_{p2} + \Delta v_t) - i_{g2} \times v_{p1}}{\Delta i_t \times (v_{p2} + \Delta v_t)}; \quad (8)$$

the S4 is as follows: according to a formula (6) and a formula (8), a value of $A_s(s)$ is obtained:

$$A_s(s) = -\frac{G_c}{1 + G_c} Z_{filter}(s); \quad (9)$$

a formula (9) is substituted into a formula (7), and a value of $B_s(s)$ is obtained:

$$B_s(s) = \frac{-i_{g2}}{v_{p2} + \Delta v_t}(Z_{filter}(s) + A_s(s)); \quad (10)$$

in the S5, since the voltage operating point of the converter generally remains unchanged or changes in a small range without major changes in a system operation, $V_1$ is considered to be basically unchanged under a predetermined stable operating condition, according to the formula (1) and a formula (2), $A_s(s)$ and $B_s(s)$ are expressed as a linear function of a current operating point $I_1$ of the converter, wherein $$\begin{cases} A_s(s) = a_0 + a_1 I_1 \\ B_s(s) = b_0 + b_1 I_1 \end{cases}; \quad (11)$$

a relational expression between the impedance value of the converter and the plurality of current operating points is obtained by solving values of the coefficients $a_0$, $a_1$, $b_0$, $b_1$ under a disturbance frequency $f_p$, and then the impedance value of the converter at other current operating points is calculated by the relational expression without a repeated measurement at each operating point.

2. The measurement method for the impedance of the converter at the plurality of operating points based on the secondary-side disturbance according to claim 1, wherein a method for solving the values of the coefficients $a_0$, $a_1$, $b_0$, $b_1$ is:

when the voltage operating point of the converter changes in the small range, two different current operating points $I_{01}$, $I_{02}$ of the converter are randomly selected, and an impedance measurement of a full frequency band is performed according to the method, and values of the expressions $A_s(s)$ and $B_s(s)$ of the converter at the two different current operating points are obtained; then, at each measurement frequency point, the values of the coefficients $a_0$, $a_1$, $b_0$, $b_1$ are obtained by a simultaneous calculation of equations (12) and (13):

$$\begin{cases} a_0 + a_1 I_{01} = A_s(s)|_{I_1 = I_{01}} \\ a_0 + a_1 I_{02} = A_s(s)|_{I_1 = I_{02}} \end{cases}; \quad (12)$$

$$\begin{cases} b_0 + b_1 I_{01} = B_s(s)|_{I_1 = I_{01}} \\ b_0 + b_1 I_{02} = B_s(s)|_{I_1 = I_{02}} \end{cases}. \quad (13)$$

\* \* \* \* \*